(12) United States Patent
Ticknor et al.

(10) Patent No.: US 6,296,717 B1
(45) Date of Patent: Oct. 2, 2001

(54) REGENERATION OF CHEMICAL MECHANICAL POLISHING PADS IN-SITU

(75) Inventors: Adam D. Ticknor, Wappingers Falls; Karl E. Boggs, Hopewell Junction; Kenneth M. Davis, Newburgh; William F. Landers, Wappingers Falls; Michael L. Passow, Pleasant Valley, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/330,657

(22) Filed: Jun. 11, 1999

(51) Int. Cl.[7] ................................................. C23G 1/36
(52) U.S. Cl. ................................... 134/10; 134/4; 134/5; 134/12; 216/2; 438/690; 438/691; 438/692; 438/693; 451/61; 451/307; 451/548
(58) Field of Search ................................ 451/41, 60, 173, 451/307, 548; 438/690–693; 134/4, 5, 10, 12; 216/2

(56) References Cited

U.S. PATENT DOCUMENTS 5,692,947 * 12/1997 Talieh et al. .......................... 451/41
6,022,268 * 2/2000 Roberts et al. ...................... 451/548
6,099,394 * 8/2000 James et al. .......................... 451/72

FOREIGN PATENT DOCUMENTS 11-151659 * 6/1999 (JP) .............................. B24B/37/00

* cited by examiner

Primary Examiner—Randy Gulakowski
Assistant Examiner—M. Kornakov
(74) Attorney, Agent, or Firm—H. Daniel Schnurmann

(57) ABSTRACT

An in-situ method for regenerating a chemical-mechanical polishing pad which includes the steps of: forming the polishing pad by dispensing liquid moldable material, such as wax, polymers or water, on a polishing surface and solidifying the liquid material by reducing the temperature, allowing the moldable material to harden; distributing slurry material on the polishing pad; polishing the surface of a semiconductor wafer with a combination of the slurry material and the polishing pad; and regenerating in-situ the polishing pad. This method quickly, easily and repeatably, resurfaces and refreshes the surface on which the a semiconductor wafer is polished. The polishing pad may also include abrasives embedded therein to enhance its polishing capabilities.

14 Claims, 3 Drawing Sheets

REGENERATION OF CHEMICAL MECHANICAL POLISHING PADS IN-SITU

FIELD OF THE INVENTION

This invention is related generally to a method and a structure for chemically-mechanically polishing (CMP) the surface of a wafer, and more particularly, to a method of resurfacing and remolding in-situ a pad used for planarizing the surface of the wafer to eliminate the problem of pad aging due to extended use.

BACKGROUND OF THE INVENTION

In the Chemical Mechanical Polishing process, the surface of a semiconductor wafer is removed by holding the face of the wafer against a moving polishing pad coated with slurry (Note: a pad is a material that protects the surface of the polishing tool and facilitates the movement of the slurry underneath the wafer, while conforming itself to the surface of the wafer). With time, the surface of the pad produces changes which affect the polishing rate, uniformity, and defect densities on the wafer. To overcome the degradation in the surface properties of the pad, many of the pads used in the CMP process require conditioning, i.e., abrading and washing the surface of the pad to expose a fresh surface for polishing. However, the bulk properties affecting the ability of the pad to planarize a wafer change as the pad becomes thinner. Polishing each wafer on a freshly generated pad reduces wafer to wafer variability; however, it is unrealistic to change pads after each wafer due to the cost and tool down time.

Etchants have been used in the art to selectively planarize certain areas of a wafer, as described for instance in U.S. Pat. No. 5,348,615 to Gupta. Yet, such an approach is inadequate for the more versatile chemical mechanical polishing process which ideally requires a combination mechanical abrasive components as well as the chemical component (chemical components are not solely etchants), as will be described hereinafter when describing the present invention, and more specifically for supplying slurry for CMP, which by their inherent nature are not limited to localized sub-micron scale areas.

Several attempts have been tried in the past to achieve the stated goal as, for instance, in U.S. Pat. No. 5,283,989 to Hisasue et al. Therein is described the formation of ice particles used as an abrasive agent. Such a material lacks the necessary properties required to incorporate the abrasive component normally found in slurry to become pad material to regenerate the pad itself.

Mechanical grinding has, oftentimes, been successfully used to regenerate the surface of an object, as described, e.g. in U.S. Pat. No. 4,785,587 to Reich et al. However, this approach suffers from serious drawbacks, as for instance, by introducing micro-fractures which render the surface of the wafer unusable. Further, mechanical grinding by itself possesses certain disadvantages by not being simultaneously combined with chemical reaction, as required by CMP. Moreover, a mechanical approach is unable by itself to regenerate the resurfacing material between uses and to liquefy the binder for the polishing abrasive during use, although it would be equally acceptable for the pad to remain solid during the polishing process and then be resurfaced and refreshed by a process unrelated to the wafer polish before subsequent wafers are processed.

OBJECT OF THE INVENTION

Accordingly, it is an object of the invention to regenerate the surface of a polishing pad used for a CMP process.

It is another object of the invention to regenerate the surface by first depositing a liquid material onto the polishing table, by reducing the temperature of the material to a point where solidification takes place, and by using the solidified material as the polishing surface for the wafer.

It is a further object of the invention to quickly, easily and repeatably, resurface and refresh the surface of an object which requires polishing without introducing micro-fracture defects.

It is yet another object to achieve consistency and planarity of the surface by periodically removing some or all the material followed by redepositing additional material to maintain a fresh surface at all times.

It is still another object of the invention to generate a new surface without abrasive conditioning as performed today to eliminate concerns with pad contamination that can introduce defects.

It is a more particular object to use regenerated pads to reduce polisher downtime as pads could be fed continuously to the tool by bulk distribution, typical, as to what is used for slurry.

SUMMARY OF THE INVENTION

In one aspect of the invention, there is provided a method for remolding a chemical-mechanical polishing pad (CMP), the pad having a resilient, planar polishing surface, made of a material which is moldable at elevated temperatures.

The resilient, planar surface is characterized by having abrasives embedded therein, which becomes moldable at elevated temperatures.

In another aspect of the invention there is provided a method for regenerating in-situ a chemical mechanical pad that includes the steps of providing a liquid moldable material such as wax; filling a polish pad mold with liquid moldable material; and reducing the temperature to allow the moldable material to harden.

In essence, the core of the invention is to quickly, easily and repeatably resurface and refresh the surface on which the semiconductor wafer is to be polished by melting the top layer of the pad as a way of supplying slurry to the pad.

BRIEF DESCRIPTION OF THE DRAWINGS

The foregoing objects, aspects and advantages of the invention will be better understood from the following detailed description of several preferred embodiments when taken in conjunction with the accompanying drawings, in which.

DETAILED DESCRIPTION OF THE INVENTION

In a first preferred embodiment of the invention, there is provided an oscillating, rotating, fixed or linear polishing table equipped with chilling and heating capability. Alternatively, another way of providing heat and cooling is achieved by sealing the polishing module of the tool and using the temperature controlled air to provide the necessary heating and cooling. With pad material containing water, microwave heating may be advantageously used.

A dam built around the edge of the polishing table retains the liquid pad material (10) until it is cooled into a solidified form (20) that will be used to polish on (30). When the surface is worn from the polishing action, it is reheated to a liquid form (40), allowed to drain off and then the process repeated (50). Scraping off the surface to expose fresh material produces equivalent beneficial results. The newly exposed surface is preferably used as is or used as a base on which new material would be deposited.

The regenerating surface for CMP taught by the invention is created by first depositing a liquid material onto the polishing table. Next this liquid materials temperature is reduced to the point where solidification takes place. This solidified material is then used as the polishing surface for the wafer. The consistency and planarity of this surface is maintained by periodically removing some or all of the material and then redepositing additional material; thus always maintaining a fresh surface.

The texture of the polish pad is also important for slurry transport and planarization properties. With the material in a liquid form, a standing wave could be set up and "frozen" into place to generate pad texture. Another scheme for generating surface texture involves imprinting the material with a plate or roller patterned with the reverse image of the desired texture during or after the solidification process. Yet another means of creating the pad's texture would be by locally melting a pattern into this material with isolated heating elements below the pad or applied from above the pad.

The pad material is likely to be wax, polymers or water that can be applied in a liquid form, solidified for polishing, and then reliquified for removal or resurfacing. Only the top surface or the entire layer of material is, preferably, removed as appropriate for a given application. These are broad classes of materials with a wide range of material properties that can be adjusted by modifying the chemical formulation and temperatures at which they are used to provide a continuum of elastic, compressive and absorption properties.

Figure 1:
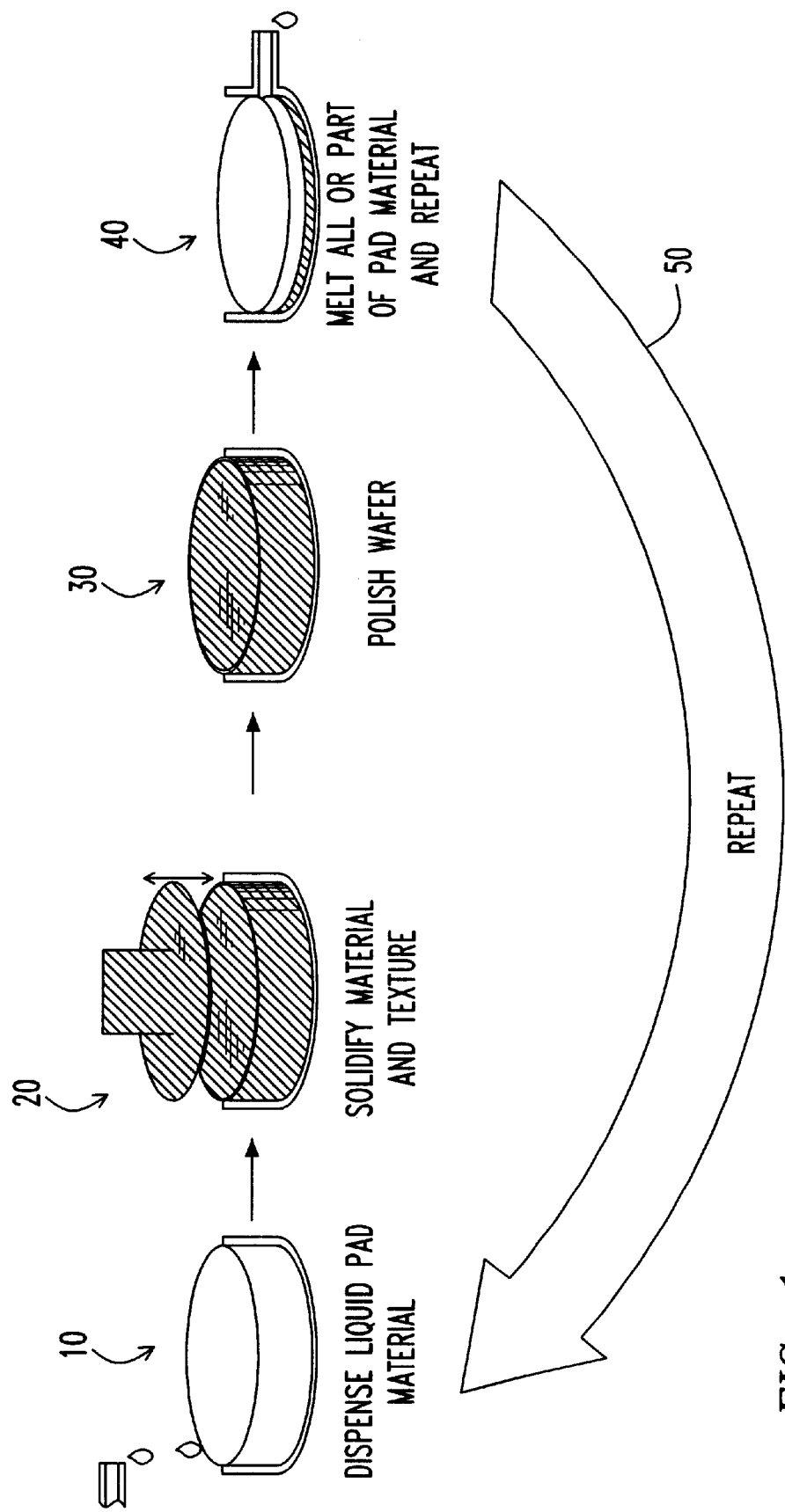
FIG. 1 is a schematic diagram illustrating a first embodiment of the present invention, wherein a pad is remolded and regenerated by forming a dam around the edge of the polishing table to retain the liquid pad material until it is cooled into a solidified form that will be subsequently used to polish on. When the surface is worn from the polishing action, it is heated to a liquid form, allowing it to drain off.
Figure 2:
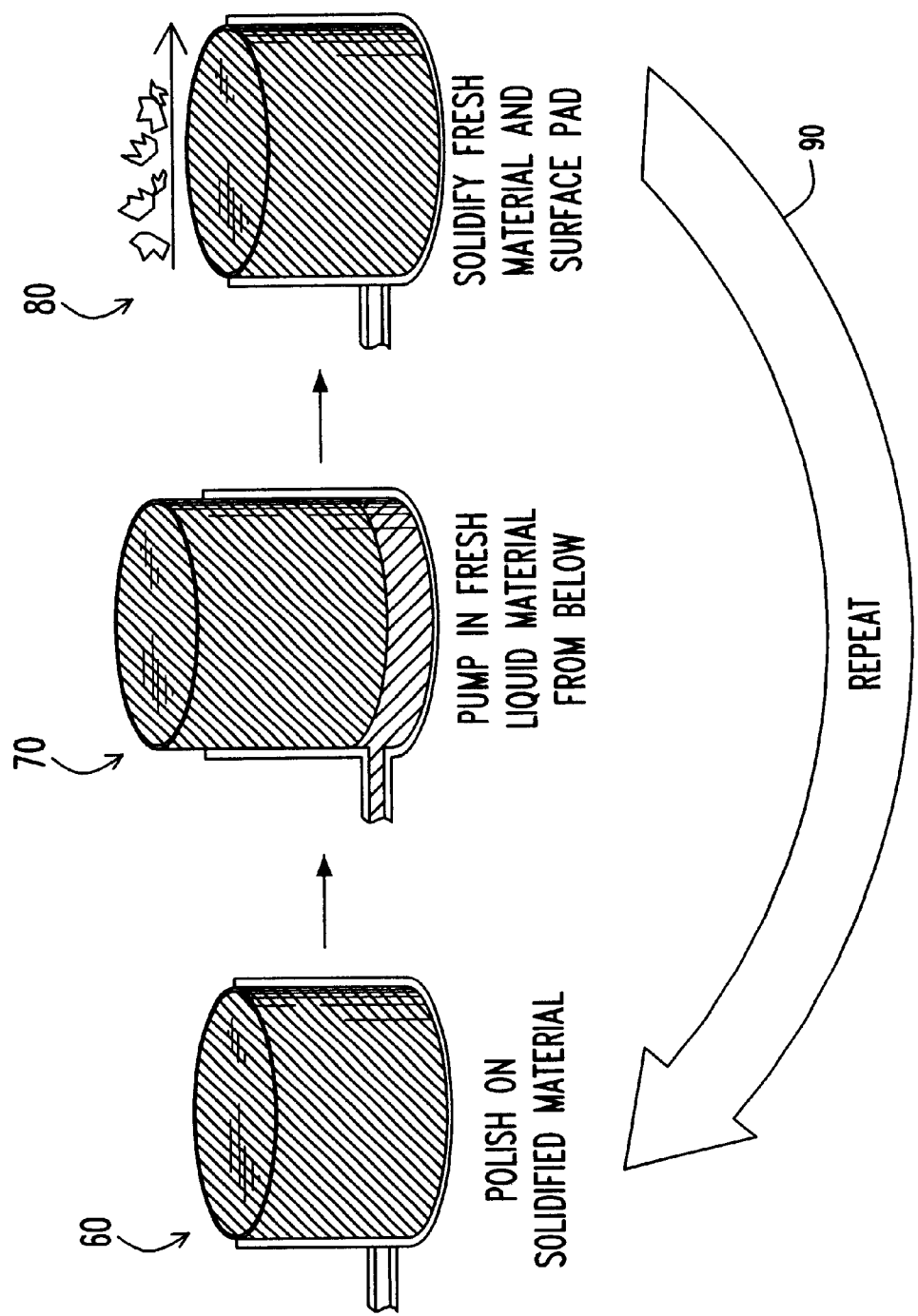
FIG. 2 is a schematic diagram of a second embodiment of the present invention illustrating the formation of a pad by continuously feeding new material to the bottom of a cylinder, letting it solidify, and pushing it up scrape off the top to expose a fresh surface.

Referring now to FIG. 2, there is shown a second embodiment of the present invention, wherein the pad is first polished on a solidified material (60) and the pad is remade by continuously feeding new material to the bottom of a cylinder (70), letting it solidify (80), push it up to scrape off the top to expose a fresh surface (not shown) and repeating the process (90).

Figure 3:
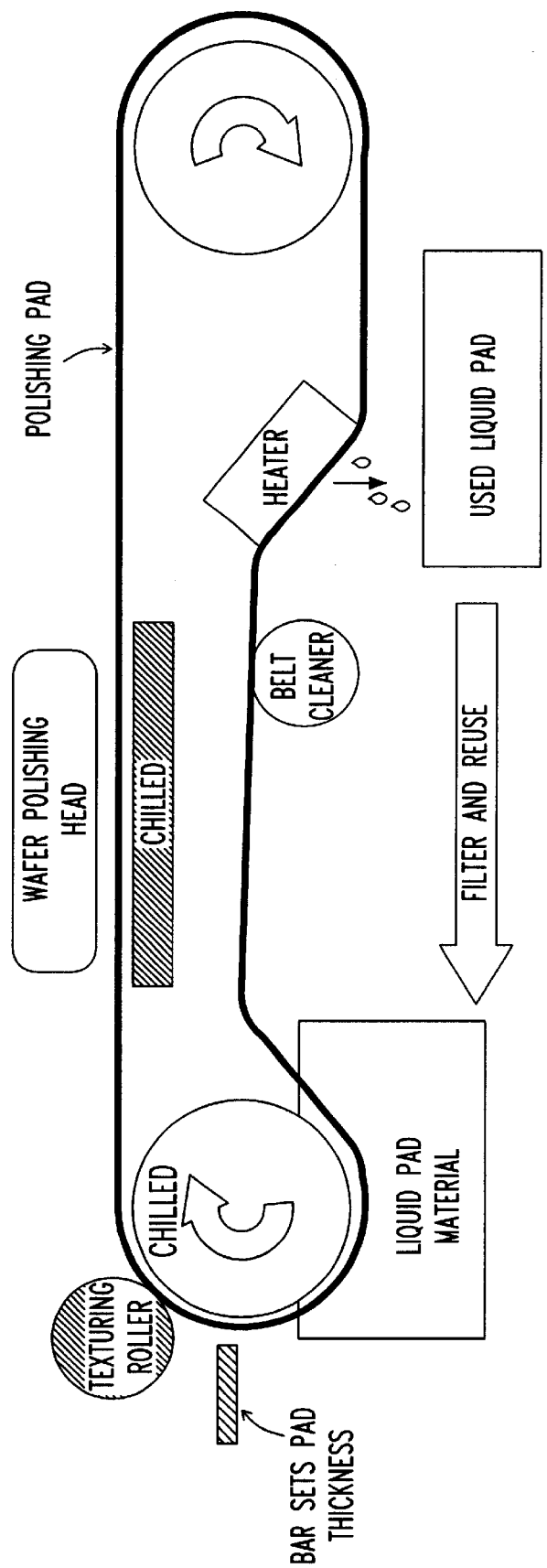
FIG. 3 is a schematic diagram of a third embodiment of the invention, wherein a rotating belt cooled at one drum beneath the polishing surface is shown and wherein pad material is frozen to the belt in the cold zone and textured as desired and selectively removed after polishing the material.

FIG. 3 illustrates a third embodiment according to the invention, wherein a rotating belt which is cooled at one drum beneath the polishing surface. A thin layer of pad material is frozen to the belt in the cold zone and textured as desired. Then after polishing the material is removed in the hot zone at the other end of the pad. The pad material may be recycled through filters. While the figure shows a horizontal pad, this embodiment works equally well in a vertical pad configuration.

In all three embodiments, texturing of the pad surface allows for a better control of the slurry transport. Melting patterns into the surface with electrical resistive element similar to a defroster used on rear car windows can be effectively used. Or, as an alternate approach, pressing the pattern into the material with a ridged plate or roller can also be advantageously used. Or, still as another alternate technique, molding the material within a close cavity may also work. All the conventional patterns (holes, grids of lines, concentric and spiral groves) as well a other geometries are seen as likely patterns.

In addition to surface texturing these polishing surfaces can be given a shape on the macro scale. A dome or dish profile across the diameter seem the most desirable as the profile can help module the uniformity with which the wafer surface is removed during polishing.

The method of regenerating a surface can be extended by incorporating some or all of the abrasive and/or chemical components of the more conventional liquid slurry into pad material. Clearly, such abrasive component is not limited to those normally found in slurry, but can also incorporate powdered silicon oxide, cerium oxide, aluminum oxide, and the like.

The heat generated by the friction from the polishing wafer could be used to liquefy a thin surface layer of slurry, or the pad and carrier can be maintained at a temperature that would keep the material solid making the process more mechanical than chemical. Incorporating the "slurry" in the pad eliminates the need to dispose of pads and slurry separately. Whether the pad contains the "slurry" or not there are opportunities to recycle this material, reducing waste and cost. Filtering and/or ion exchange would allow for purification of the spend material. With the high cost of new pads and slurry and the expense of disposing of the spent material used for CMP today there would be a market for recycling the materials.

In summary, generating a new surface without conditioning eliminates concerns with pad contamination that cause defects. Using pads that are easily regenerated reduces polisher downtime for consumable changes, as "pads" are fed to the tool continuously by bulk distribution similar to what is used for slurry today. Heating for removal and reapplication of this material can be accomplished by any number of heat sources. These include IR lamps, resistance heating in or above the polishing table and heating of the pad material ex-situ to the polisher. Cooling can be accomplished by enclosing the whole polishing module in an isolated air conditioned chamber or by localized cooling via chilled recirculating fluid through the polishing table alone, by cryogenic gases, or Peltier-type thermoelectric elements designed into the system.

By quickly stripping part or all of the used polishing pad and redepositing a fresh polishing surface for each wafer, the consistency of the polish results, rate, uniformity, defects and planarity will be better controlled than with a pad that is abraded after each wafer is polished.

Further extensions of this method includes having the frozen crystals of the pad material itself provide the abrasive for the polishing operation rather then having to add the abrasive into the slurry. Abrasive materials can be frozen into the pad during formation and regeneration of the pad. By way of example, if the pad is a frozen aqueous solution containing abrasives, the local melting at the surface that occurs when pressure is applied during the wafers polishing operation could replace today's polishing slurry while the bulk of the material remains frozen providing the surface (Pad on which to polish. By dispersing other materials into the pad before it solidifies, one could incorporate new properties into the pad improving its abrasive, cleaning and passivating characteristics. These additives could be released during the polish at a chosen rate. Pads with different properties could be optimized for polishing different materials, e.g. oxides, metal, etc.

While the invention has been described with respect to several embodiments, it will be apparent to those skilled in the art that various changes and modifications to the formation of the polishing pad can be made without departing from the spirit and scope of the invention and the appended claims.

Having thus described the invention, what is claimed and desired to secure by Letter Patent is as follows:

1. A method for regenerating in-situ a chemical-mechanical polishing pad comprising the steps:
   providing a polishing surface;
   forming said polishing pad by dispensing liquid material on said polishing surface and solidifying said liquid material;
   distributing slurry material on said polishing pad;
   polishing the surface of a semiconductor wafer with said polishing pad in combination with said slurry material; and
   remolding in-situ said polishing pad by liquifying said polishing pad, partially draining some of said liquified material and resolidifying the remaining of said liquified material.

2. The method as recited in claim 1, wherein said remolded polishing pad is provided with a resilient planar polishing surface.

3. The method as recited in claim 1, wherein said polishing pad is made of a material which is selected from the group consisting of wax, polymers and water.

4. The method as recited in claim 1, wherein said polishing pad is made of a material which becomes moldable at elevated temperatures.

5. The method as recited in claim 1, wherein in-situ regeneration is achieved by mechanically scraping the surface of said polishing pad and removing portions thereof.

6. The method as recited in claim 1, further comprising the step of purifying in-situ spent pad material.

7. The method as recited in claim 1, further comprising the step of texturing the surface of said polishing pad by dragging added slurry material underneath said polishing pad when polishing the surface of a semiconductor wafer.

8. The method as recited in claim 7, wherein texturing said polishing pad comprises the step of embossing a predetermined pattern on said polishing pad.

9. The method as recited in claim 7, wherein said texturing is achieved by heating selected portions of said polishing pad.

10. The method as recited in claim 1, further comprising the steps of:
    enclosing said liquid polishing pad in a chamber and solidifying said liquid material; and
    opening said chamber and polishing said semiconductor wafer with an exposed surface of said solidified material.

11. The method as recited in claim 1, wherein said slurry includes abrasive particles within a chemical solution.

12. A method for regenerating in-situ a chemical-mechanical polishing pad (CMP) comprising the steps:
    providing a polishing surface;
    forming said polishing pad by dispensing liquid material on said polishing surface and solidifying said liquid material;
    distributing slurry material on said polishing pad;
    polishing the surface of a semiconductor wafer with said polishing pad in combination with said slurry material; and
    remolding in-situ said polishing pad by liquifying said polishing pad, partially draining some of said liquified material, adding fresh liquid material to the bottom of said polishing pad and resolidifying the combination of said remaining liquified material and said added fresh liquid material.

13. A method for regenerating in-situ a chemical-mechanical polishing pad (CMP) comprising the steps:
    providing a polishing surface;
    forming said polishing pad by dispensing liquid material on said polishing surface and solidifying said liquid material;
    distributing slurry material on said polishing pad,
    polishing the surface of a semiconductor wafer with a combination of said polishing pad and said slurry; and
    remolding in-situ said polishing pad by liquifying said polishing pad, partially draining some of said liquified polishing pad, adding fresh liquid and slurry material said liquified polishing pad and resolidifying the combination of a remaining of said liquified polishing pad, said added fresh liquid and said slurry material.

14. The method as recited in claim 7, wherein said texturing is achieved by imprinting said polishing pad with a pattern plate or roller.

* * * * *